United States Patent [19]

Fukushima et al.

[11] Patent Number: 5,727,182
[45] Date of Patent: Mar. 10, 1998

[54] METHOD AND APPARATUS FOR ADJUSTING OUTPUT CURRENT VALUES FOR EXPANSION MEMORIES

[75] Inventors: Toshiaki Fukushima; Shinji Ohishi, both of Yamato; Masahiko Nomura, Sagamihara, all of Japan

[73] Assignee: International Business Machines Corporation, Armonk, N.Y.

[21] Appl. No.: 637,996

[22] Filed: Apr. 25, 1996

[30] Foreign Application Priority Data

Apr. 25, 1995 [JP] Japan ................... 7-101059

[51] Int. Cl.$^6$ ................... G06F 12/00
[52] U.S. Cl. ............ 395/442; 395/497.03; 365/189.05
[58] Field of Search ................ 395/497.03, 442; 365/185.23, 189.05, 189.08

[56] References Cited

U.S. PATENT DOCUMENTS 5,179,686  1/1993  White ................... 395/497.03
5,237,674  8/1993  Mohme et al. ................... 395/442

*Primary Examiner*—Eddie P. Chan
*Assistant Examiner*—Reginald G. Bragdon
*Attorney, Agent, or Firm*—George E. Grosser

[57] ABSTRACT

A memory access control apparatus, which is employed for a computer system in which an expansion memory can be installed in addition to a standard memory and which controls the access to the memory by one or more signal lines, comprises an identification circuit for reading identification data of the installed expansion memory, a determination circuit for determining the optimal output current values for the signal lines based on the identification data; and a memory controller for adjusting the output current values of the signal lines based on the results obtained by the determination means. Even when multiple types of expansion memories (DIMM cards) whose memory capacities and memory chip arrangements are different are installed, the waveforms and the timings for the output signal lines (RAS, CAS, WE, and MA) of the memory controller can be dynamically compensated for.

7 Claims, 8 Drawing Sheets

METHOD AND APPARATUS FOR ADJUSTING OUTPUT CURRENT VALUES FOR EXPANSION MEMORIES

FIELD OF THE INVENTION

The present invention relates to a memory access control apparatus and a memory access control method that are employed in a computer system, and in particular, the present invention relates to a memory access control apparatus and a memory access control method for appropriately compensating for the operational characteristics of the individual signal lines on a memory bus that is employed to control memory access.

DESCRIPTION OF THE BACKGROUND

In line with the current level of technical development, various types of personal computers, such as desktop types and notebook types, are produced and are for sale on the market.

It is well known that a personal computer (hereafter referred to a "PC") comprises multiple devices, such as a CPU, main memory, a ROM, a memory controller, a DMA controller and so on. The CPU communicates with these devices along common signal transfer paths (so-called "buses") that includes address signal lines, data signal lines, and control signal lines. The CPU and the devices can transmit their intentions to each other by exchanging, via the signal lines, signals that consist of the combinations of low and high logic levels. The CPU executes various applications under the control of an operating system (OS). The main memory is a storage device that permits reading and writing, and is employed as an area wherein the operating system or an application is loaded, or as a work area wherein the CPU executes a task. Generally, for the main memory DRAM (Dynamic Random Access Memory) is used that can provide a large memory capacity at a low cost, even though the access speed for RAM is slower than that for a SRAM (Static Random Access Memory).

The memory capacity of the main memory that is installed as the standard in a PC is, for example, approximately 4 MB or 8 MB. However, in many cases a memory capacity of more than the standard memory is required because the memory capacity influences the execution speed of a system and because a larger memory capacity enables the use of a large applications and graphics. Many of the current PCs, therefore, permit the installation of the expansion of memory. The SIMMs (Single Inline Memory Modules) and the DIMMs (Dual Inline Memory Modules), which are specific examples of expansion memory, are memory cards where a plurality of DRAM chips are arranged on a substantially rectangular print board. The PC has a slot, on the main board, for retaining the card edge terminal of a DIMM or a SIMM, and a terminal can be inserted into and removed from the main board as needed. A plurality of types of DIMMs are already sold in the market: 2 MB (1 bank), 4 MB (1 bank/2 banks), 8 MB (1 bank/2 banks), 16 MB (1 bank/2 banks), and 32 MB (2 banks).

Figure 1:
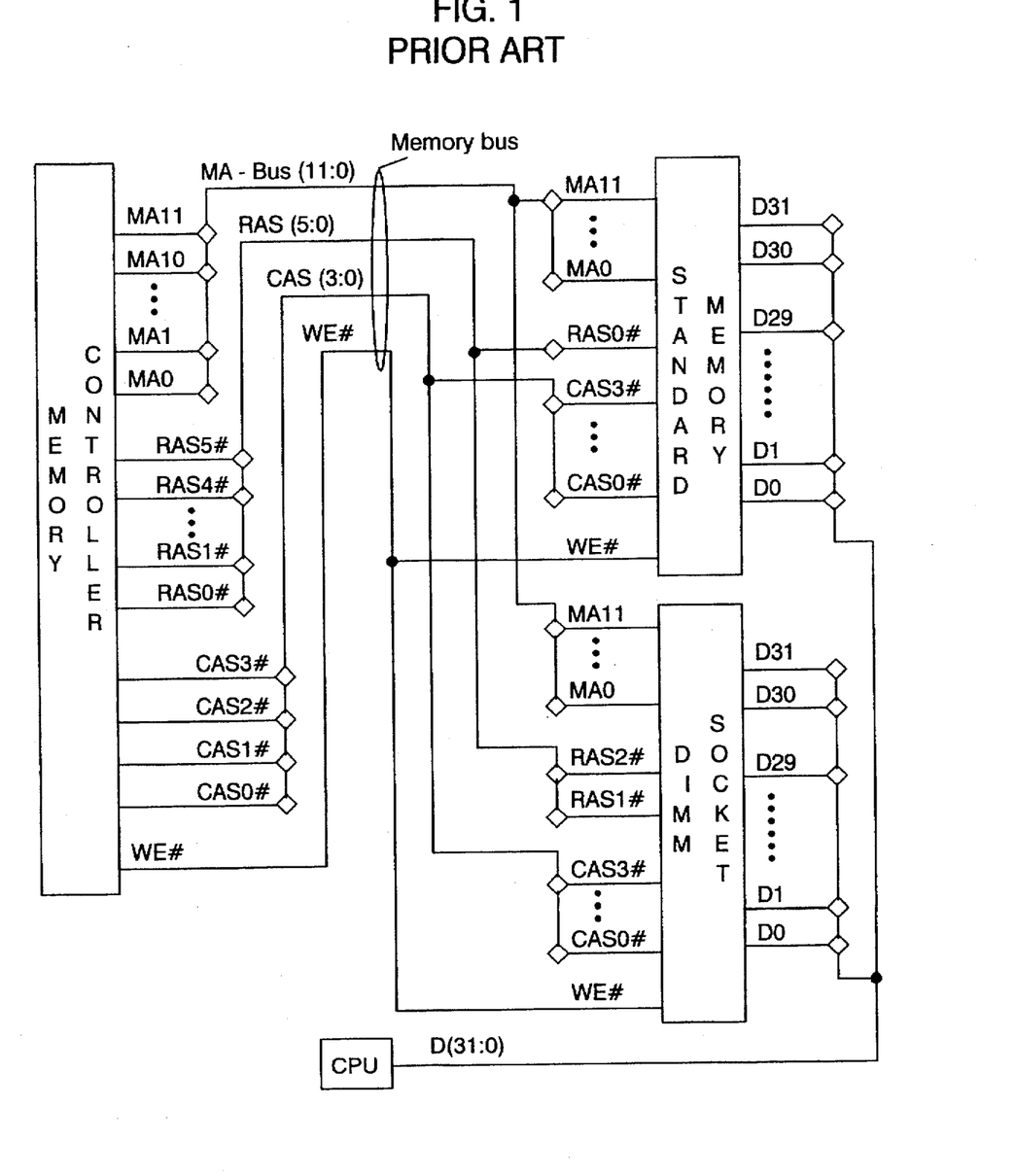
FIG. 1 is a diagram showing a conventional example for maintaining the driving strength of a memory controller.

A request fore the CPU for access to the standard memory or to the expansion memory is processed by the memory controller. More specifically, when a request for memory access is issued, the memory controller determines in which DRAM chip and at which location in the DRAM chip is located the desired data, and controls the access to that chip. FIG. 1 is a specific diagram showing peripheral components for memory in the PC (although the PC comprises many other hardware components, for the convenience of sake they are not shown). In FIG. 1, the PC includes a DIMM socket for retaining a DIMM card, in addition to the standard memory. Extending from the memory controller to the standard memory and to the DIMM socket is a memory address (MA) bus, which includes twelve signal lines for specifying a memory address, six row address strobe (RAS) signal lines for controlling the timing for the reading of a row address in each memory chip, four column address strobe (CAS) signal lines for controlling the timing for the reading of a column address in each memory chip, and one WE signal line for forcing data writing (it should be noted that the number of signal lines merely conform to the standards for buses and are not essential to this description). These signal lines are also collectively called "a memory bus." The standard memory and the DIMM socket communicate with the CPU across a 32-bit data bus for the exchange of data. The memory controller controls the access to the standard memory and the DIMM card by transmitting, at a predetermined timing interval, a signal that is a combination of low and high level signals to each signal line of the memory bus.

Figure 2:
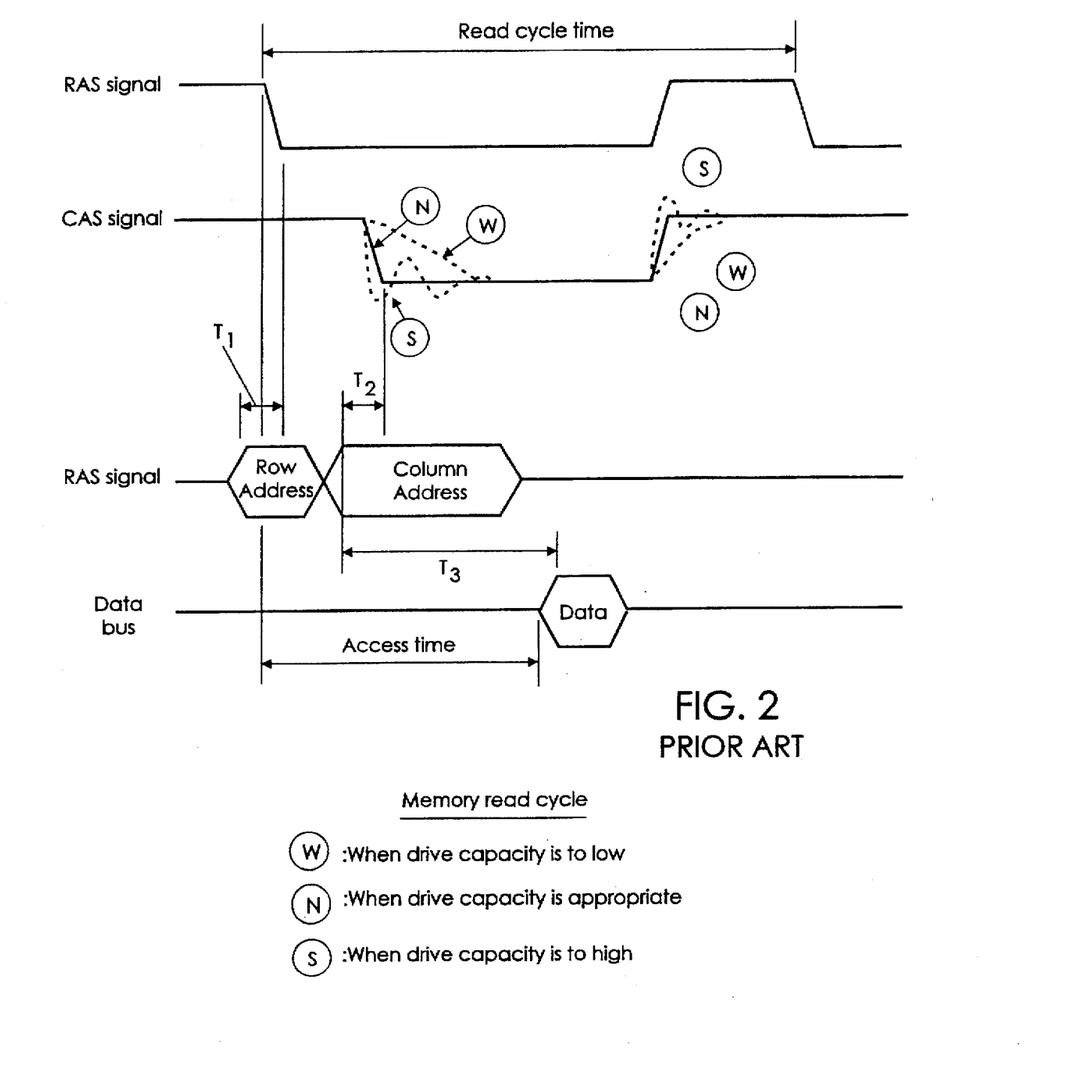
FIG. 2 is a time chart showing the memory reading operation (it should be noted that signals RAS, CAS, WE are active low).

The memory access control process performed by the memory controller will now be explained by using a memory reading example. FIG. 2 is a timing chart showing the memory read processing (it should be noted that in this example the signals RAS, CAS, and WE are transmitted active-low). In FIG. 2, the memory controller transmits the RAS signal following the elapse of a predetermined time $T_1$ after a row address that was transmitted to the MA bus has been confirmed. In response to the RAS signal, a row address is latched and decoded in the memory. Also, the memory controller transmits the CAS signal following the elapse of a predetermined time $T_2$ after a column address that was sent to the MA bus has been confirmed. In response to the CAS signal, the column address is latched and decoded in the memory. Further, following the elapse of a predetermined time $T_3$ after the column address that was sent to the MA bus has been confirmed, data are outputted at the pertinent memory address in the memory. The CPU reads the output data before the next CAS signal rises. The WE signal is not transmitted during the memory reading.

As the processing speed of a CPU is increased, the difference in speed between the CPU and the DRAM tends to become large. The memory access time is one of the factors that contributes to overhead in a computer system, and it can be said that the reduction in the memory access time is an urgent necessity for PC designers. To shorten the memory access time, the capability to switch the RAS, CAS, and WE signals from low level to high level within a predetermined time is required for the memory controller (such a capability for a device is called its "driving strength"). In the memory read cycle that is shown in FIG. 2, for example, the driving strength of the CAS signal, for which the interval between its rise and its fall is the shortest, is the most critical. If the driving strength is low, a response becomes slowly excessive when the signal rises and falls. Such a response delays the fitting for the reading of a column address and the data output timing, and reduces the time margin. On the other hand, when the driving strength is too high, vibrations occur on the rise and the fall of a signal, and a voltage margin is reduced. Time is required to stabilize a signal and operational errors are induced.

Figure 3:
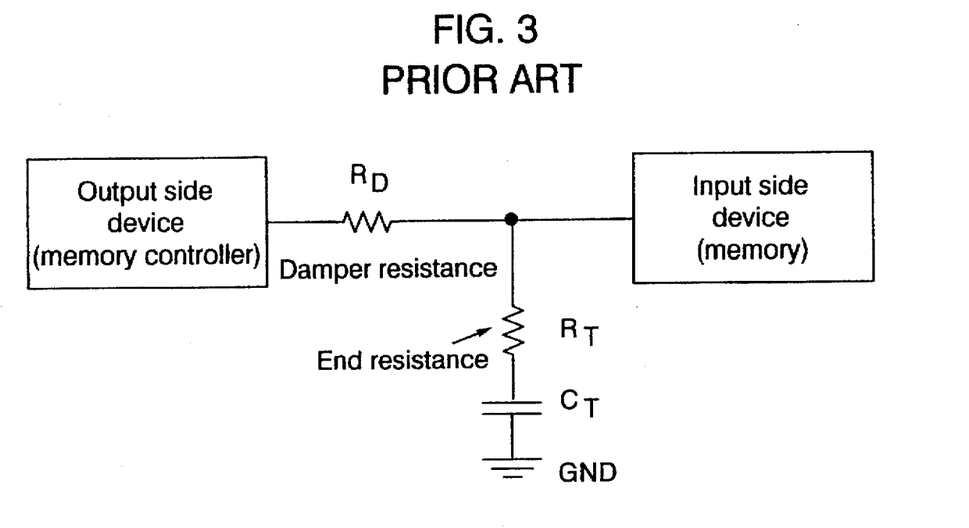
FIG. 3 is a diagram illustrating a conventional example for adjusting a signal waveform and a timing.

To adjust the waveforms and the timings for the signals, one conventional approach is shown in FIG. 3 which uses a damping resister $R_D$ inserted in series into the output signal line for the output side device (including the memory controller). Also, a termination circuit that includes resister $R_T$ and capacitor $C_T$ is connected in parallel. In this case, the damping resister $R_D$, the resister $R_T$, and the capacitor $C_T$ are adjusted to their optimal values by performing simulation, experimentation, and investigation during the designing and manufacturing process. This method, however, does not directly and dynamically adjust the driving strength of the device.

Figure 4A:
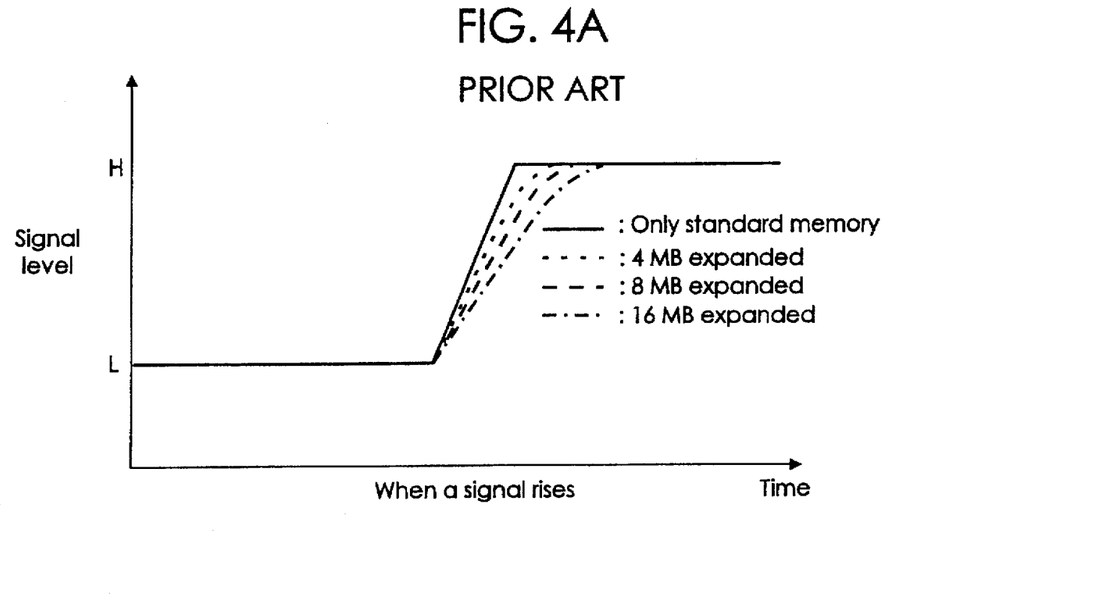
FIGS. 4A and 4B are specific graphs showing investigation data indicating that the waveform of an output signal of a memory controller and the timing vary in response to the capacity of a DIMM card that is installed in a DIMM slot.
Figure 4B:
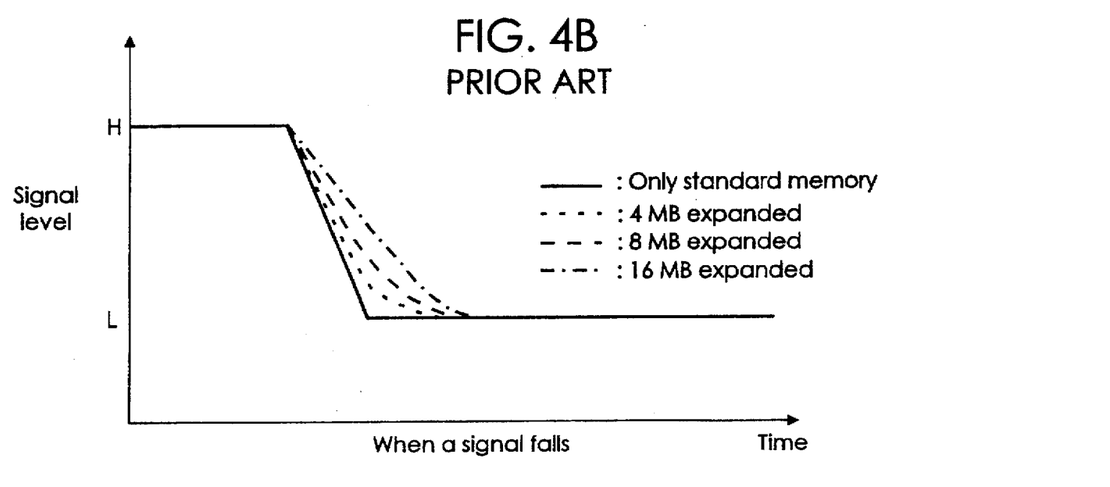

It is expected that the optimal values for the parameters of the damping resister $R_D$, the resister $R_T$, and the capacitor $C_T$, will vary in response to the size of the loads placed on input side devices i.e., the memory. The load on the memory controller, for example, is easily and dynamically changed by inserting a DIMM card or by changing the type of the DIMM card that is used. The present inventors confirmed through experimentation, which was based on their experiences, that the waveforms and the timings for the output signals of the memory controller vary in response to the capacity of the DIMM card that is loaded into the slot. FIGS. 4(A) and 4(B) is a graph showing investigation data for a rising and a falling output signal respectively. Referring to the graph in FIGS. 4(A) and 4(B), it is apparent that the waveform of the RAS signal becomes gradually less sharp as the memory capacity of the expansion memory is increased to 4 MB, to 8 MB, and to 16 MB.

Figure 5A:
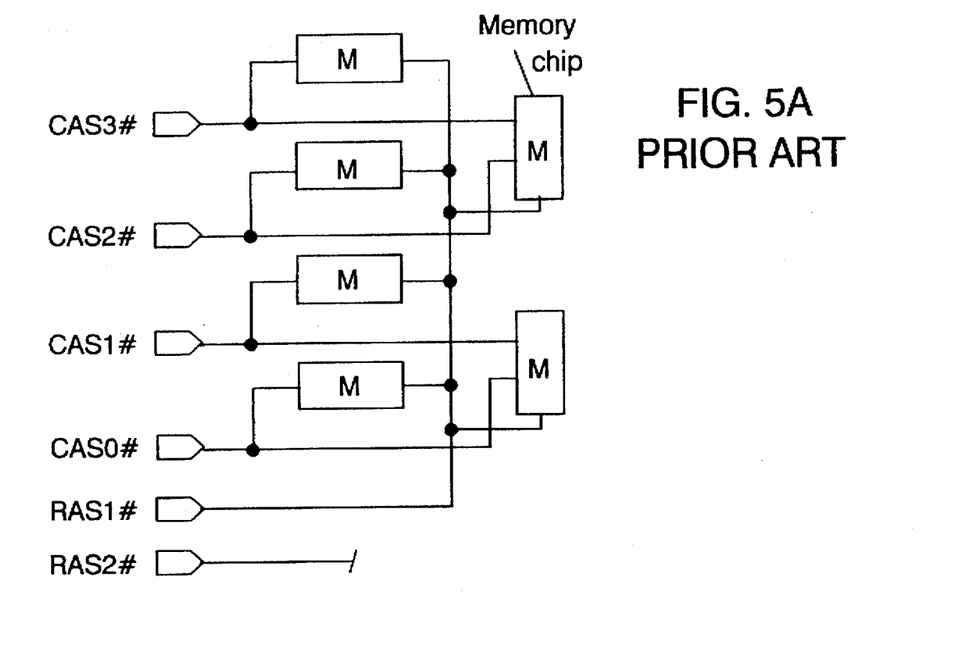
FIGS. 5A and 5B are specific diagrams showing the arrangements of memory chips for a 8-MB 1-bank system and an 8-MB 2-bank system.
Figure 5B:
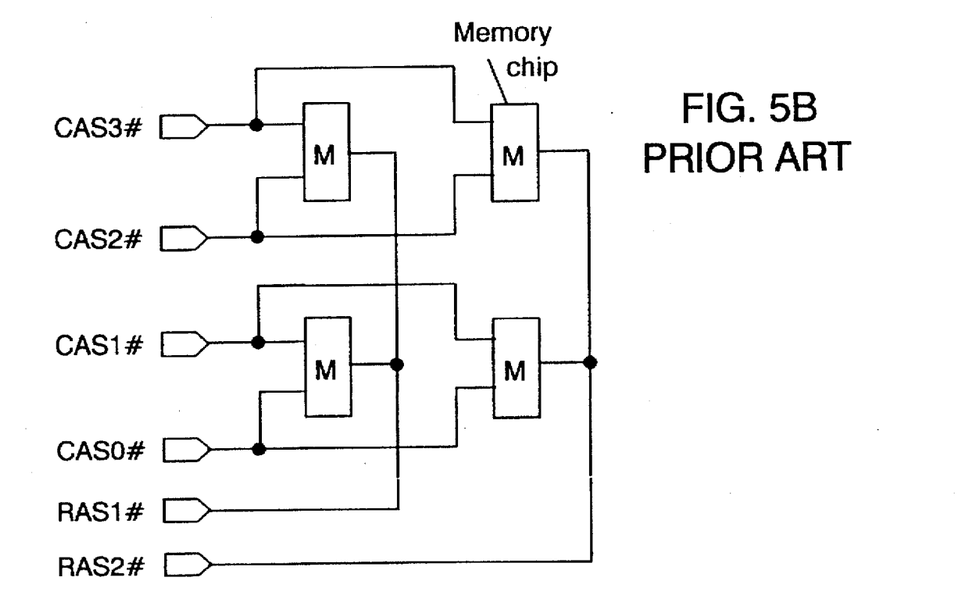

Further, the present inventors were led to accept the fact that the driving strength of the individual signal lines of the memory controller are influenced by the arrangement of memory chips (i.e., the number of banks), even if the memory capacity of the DIMM card is the same. FIGS. 5(A) and 5(B) are specific diagrams showing the arrangement of memory chips on the DIMM card for an 8-MB 1-bank system and for an 8-MB 2-bank system, respectively. It should be noted that the WE signal and the MA signal are apparently inputted to all the memory chips and these signal lines are not shown. Supposing that a load on the individual signal lines is proportional to the number of memory chips to which the signals are inputted, the load on each signal line in the 1-bank system is (WE, MA, CAS, RAS1#, RAS2#= (6, 6, 2, 6, 0), while the load on each signal line in the 2-bank system is (WE, MA, CAS, RAS1#, RAS2#)=(4, 4, 2, 2, 2). The optimal drying strength of the signal line depends on the memory chip arrangement on the DIMM card, and the influence on each signal line is varied. However, it is extremely difficult, at the development step, for a value of the damping resister and a value of the end circuit to be adjusted to their optimal values in order to support all types of DIMM cards. Therefore, the approach shown in FIG. 3 would generally result in an extension of the development period and an increase in cost.

Figure 6:
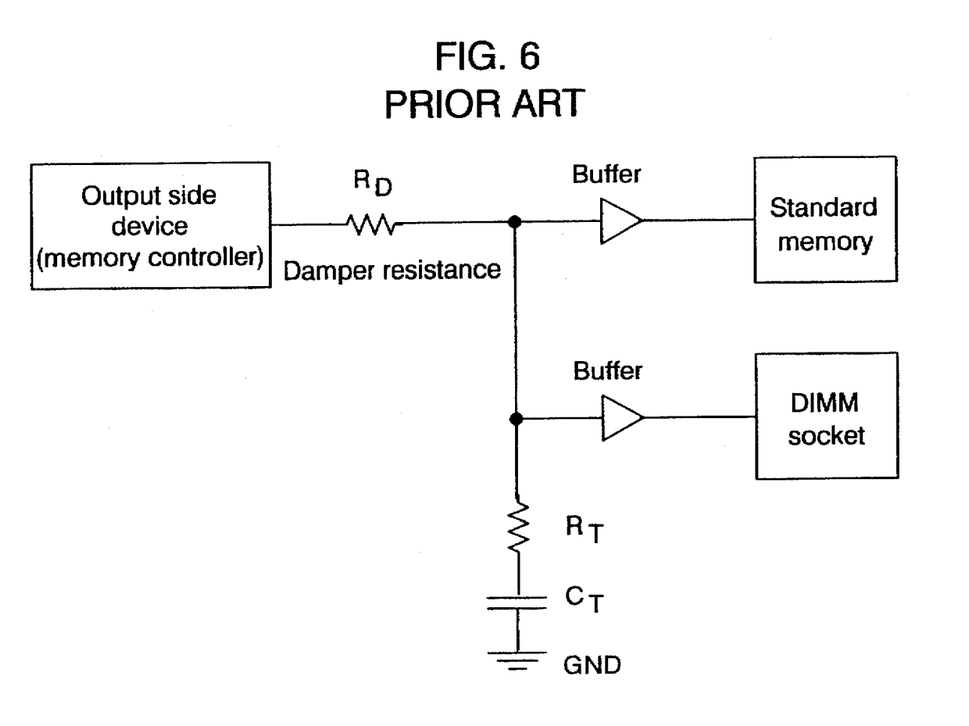
FIG. 6 is a specific diagram illustrating peripheral components of memory (standard memory and a DIMM card) in the PC.

In another conventional approach, shown in FIG. 6, a buffer is inserted in the output signal lines that run from the memory controller to the standard memory and the DIMM socket. In this case, when the DIMM card is inserted and the load is increased, a signal that is inputted directly to the memory is driven by a buffer, so that the driving strength of the memory controller is not seen from the memory side. Further, the change in a load due to the insertion of the DIMM card is not seen from the memory controller side. It should be noted that by this method, since a buffer must be inserted into each signal line of the memory bus, the cost is increased accordingly, and the buffer uses extra area on the main board to be mounted. Further, the transmission of a signal is delayed because a buffer has been inserted.

Therefore, there exists a need for a memory controller that can support an environment where a user can mount, as needed, an expansion memory that has a different memory capacity or a different memory chip arrangement without sacrificing any timing penalty for each configuration.

SUMMARY OF THE PRESENT INVENTION

Briefly, according to the present invention, a memory access control apparatus, which is employed for a computer system in which an expansion memory in addition to a standard memory can be installed and which uses one or more signal lines to control access to the memory, comprises: an identification circuit for reading identification data for the expansion memory that is installed; determination circuit for employing the identification data to determine optimal output current values for the signal lines; and a memory controller for employing results that are obtained with the determination means to adjust output current values of the signal lines.

DESCRIPTION OF THE PREFERRED EMBODIMENT

A. Hardware structure of a personal computer

Figure 7:
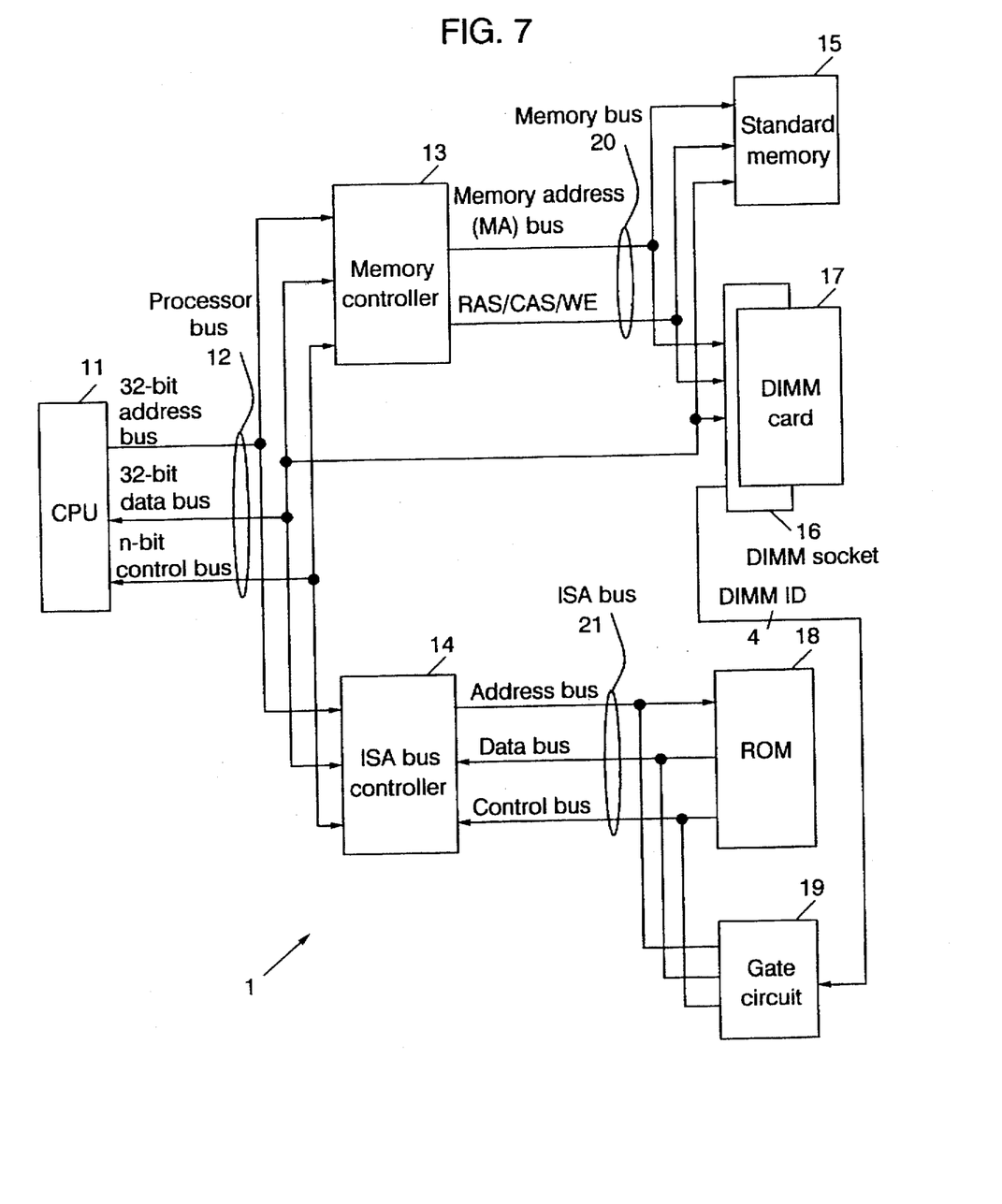
FIG. 7 is a block diagram illustrating the connection relationship among primary hardware components of a personal computer (PC) 1 according to one embodiment of the present invention.

FIG. 7 is a block diagram illustrating the connection relationship of the primary hardware components in a personal computer (PC) 1 according to one embodiment of the present invention. Although the PC 1 includes wiring for coupling these components to many other components, that is not relevant to the description of the embodiment and will not be shown.

In FIG. 7, a CPU 11 communicates with other devices, such as a memory controller 13 and an ISA bus controller 14, via a processor bus 12 that includes a 32-bit address bus, a 32-bit data bus, and n-bit control bus (n is a positive integer). The processor bus 12 may be, for example, a VL (VESA Local) bus. The CPU 11 executes various applications under the control of the operating system, and issues a request for memory access to the memory controller 13 when necessary. The CPU 11 may be, for example, a SL Enhanced Intel 486 DX2 CPU that is produced by Intel Corp.

The memory controller 13 is a device that determines in which DRAM chip of a memory 15 or 17 and at which location in the DRAM chip is located the data for which access is requested, and that enables the memory access. Via a memory bus 20 that includes a memory address (MA) bus and signal lines RAS, CAS, and WE, the memory controller 13 is connected to a standard memory 15 and a DIMM socket 16.

While the standard memory 15 and the DIMM socket 16 are connected to the memory bus 20, they are bidirectionally coupled with the data bus that is included in the processor bus to enable the CPU 11 to read and to write data.

As described before, the standard memory 15 is a DRAM and has a memory capacity of, for example, 4 MB. The DIMM socket 16 has a mechanical structure for permitting the attachment of a card edge terminal (not shown) of a DIMM card 17. A DIMM (Dual Inline Memory Module) is one type of the standard memory cards that have five memory capacities: 2 MB, 4 MB, 8 MB, 16 MB, and 32 MB. Since a 2-MB DIMM has only a 1-bank structure, a 32-MB DIMM has only a 2-bank structure, and 4-MB, 8-MB, and 16-MB DIMMs have both 1-bank and 2-bank structures, there are actually 8 types of DIMM cards. Each DIMM card is given an ID number that is in response to its own memory capacity and its bank structure. The ID number is read from a predetermined terminal among the card edge terminals (which will be described later). The ISA bus controller 14 controls the exchange of data by the processor bus 12 and an ISA (Industry Standard Architecture) bus 21. The ISA bus 21 is employed to connect together a ROM 18 and peripheral devices (not shown), such as a hard disk drive (HDD), a floppy disk drive (FDD), a PC card, and a keyboard/mouse.

The ROM (Read Only Memory) 18 is a non-volatile memory for reading only, for which written data are determined during the manufacturing process. For example, a program (POST: Power-on Self Test) (which will be described later) that is executed at the time of activation and a hardware control program (BIOS: Basic Input/Output System) are encoded and the resultant programs are stored semipermanently.

The 4-bit signal line for the 1213 number identification that is outputted from the DIMM socket 16 is connected not to the processor bus 12 and the memory bus 20 but to the ISA bus 21, via a gate circuit 19. Therefore, via the processor bus 12, the ISA bus 21, and the gate circuit 19, the CPU 11 can read the ID number of the DIMM card 17 that is installed in the DIMM socket 16.

B. Additional structure of a memory controller

Figure 8:
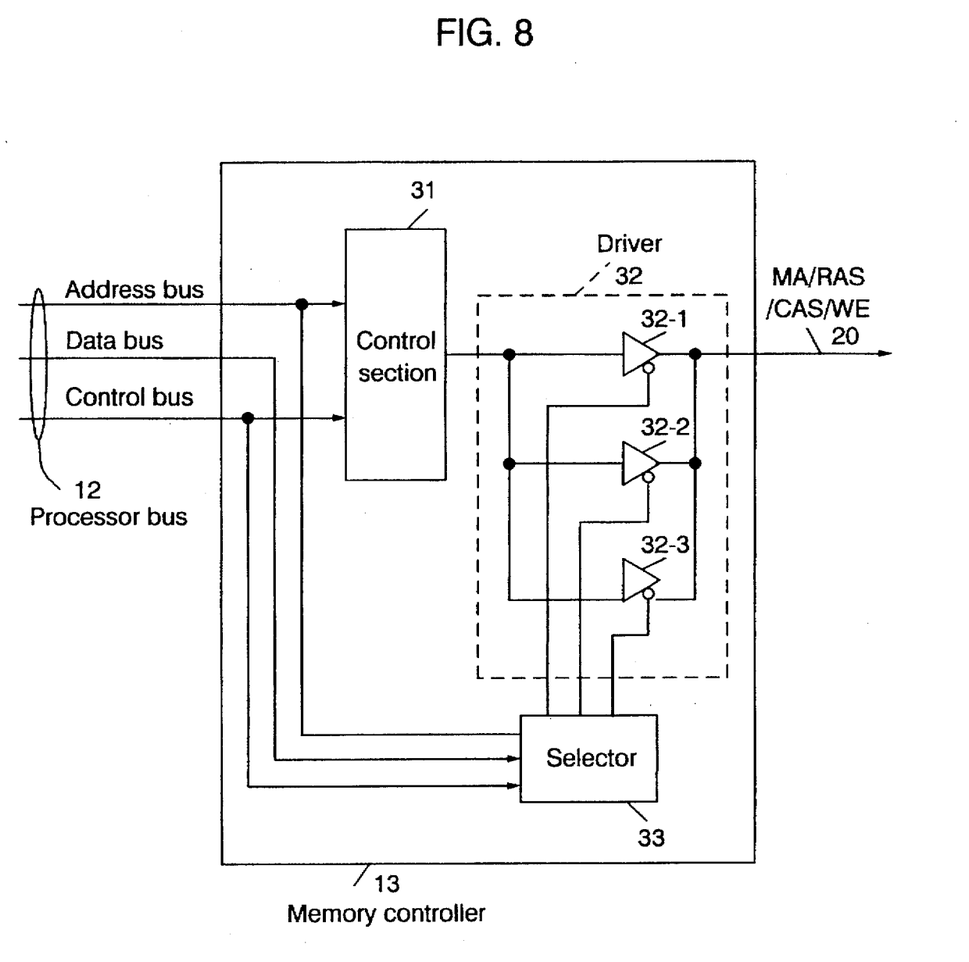
FIG. 8 is a schematic diagram illustrating the internal structure of a memory controller 13 according to the embodiment of the present invention.

The memory controller 13 handles a memory access request from the CPU 11. The memory controller 13 according to the embodiment includes additional structure components, in addition to the components that a conventional memory controller includes, in order to preferably embody the present invention (to dynamically compensate for the waveforms and the timings for the output signals RAS, CAS, WE, MA, even through the type of DIMM card 17 may differ).

FIG. 8 is a schematic diagram illustrating the internal structure of the memory controller 13 according to the embodiment. Components that are not required for the explanation of the present invention are naturally not shown.

In FIG. 8, a control section 31 is coupled with the address bus and the control bus in the processor bus 12, and outputs signals, at predetermined timing intervals, across the MA, KAS, CAS, and WE signal lines that correspond to the memory bus 20. The memory bus 20 is depicted as a single signal line for simplification.

A driver 32 wherein a plurality of buffers (three in this case) are connected together in parallel are inserted in each of the signal lines (MA, RAS, CAS, and WE) in the memory bus 20. A selector 33 transmits a control signal to a gate control terminal of each buffer 32-1, 32-2, and 32-3, and can halt the output by the individual buffers 32-1, 32-2, and 32-3.

The selector 33 is connected to the processor buses 12, and its operation is controlled by the CPU 11. In other words, in response to the data received from the CPU 11, the selector 33 forces or attenuates the output by each buffer in the driver 32.

With the above described arrangement, by changing the number of buffers to be driven in the driver 32, an output current value for a corresponding signal line, i.e., a driving strength, can be adjusted. Thus, as the CPU 11 changes the setup of the driver 32 for each signal line in response to with the expanded memory of the DIMM card 17 and its structure, the CPU 11 can dynamically alter the driving strength of each signal line in the memory bus 20.

It would be easily understood by the one having ordinary skill in the art that, with the buffer 32 being mounted on the memory controller chip 13, the mounting area can be reduced and the cost savings can be realized when compared with the prior art methods.

C. Operation of the present invention

In principle, the setup of the driving strength of the memory controller 13 can be performed while the PC 1 is being operated. However, since it is considered more appropriate that such a setup should be performed when the memories 15 and 17 are initialized or when the conditions for use are set, in this embodiment the driving strength of the memory controller 13 is set during the execution of the POST.

Figure 10:
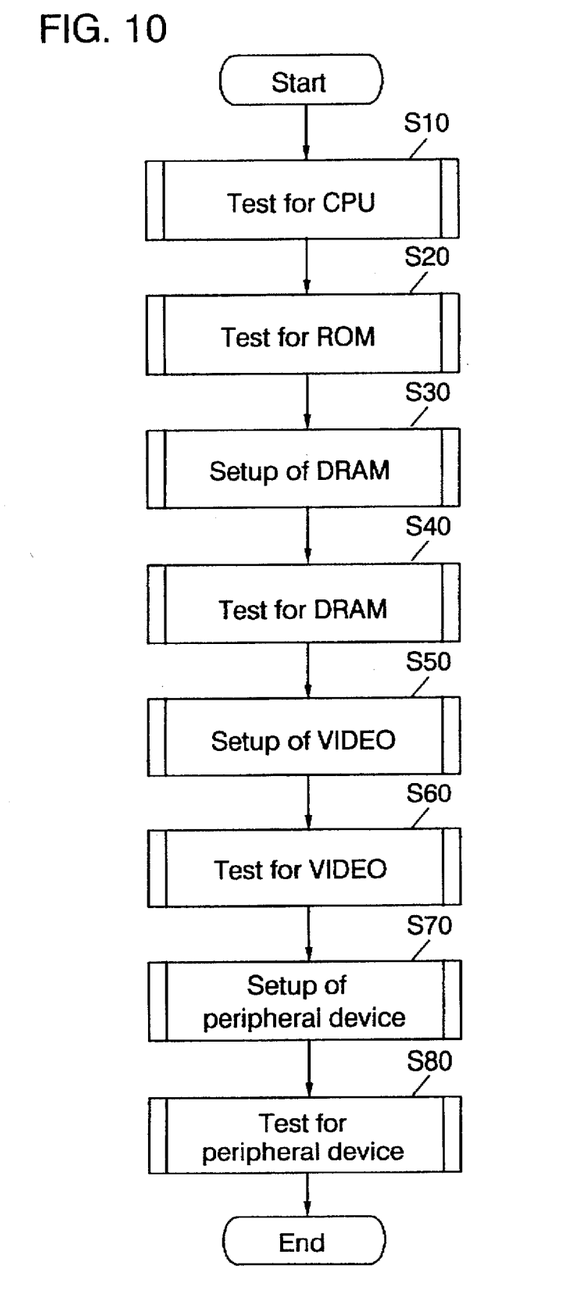
FIG. 10 is a detailed flowchart of a setup routine for a DRAM.

FIG. 10 is a flowchart of the entire POST program that is used in the PC 1 according to the embodiment. The POST is an assembly of self diagnostic test routines for examining whether or not hardware components are correctly operated when the PC 1 is powered on and before the operating system is booted. As is shown, the POST test routines are executed in order, with the test for the CPU 11 (S10) being followed by the test for the KOM 18 (S20), the setup of the DRAM (the standard memory 15 and the expansion memory 17) (S30), the test for the DRAM (S40), the setup of a video peripheral device, (S50), the test for the video peripheral device (S60), and the setup and the testing of other peripheral devices (S70) and (S80). After the POST is executed, the operating system is booted and the right of control of the system is given to it. The POST is actually firmware that is stored in the ROM 18. (which was previously described).

Figure 9:
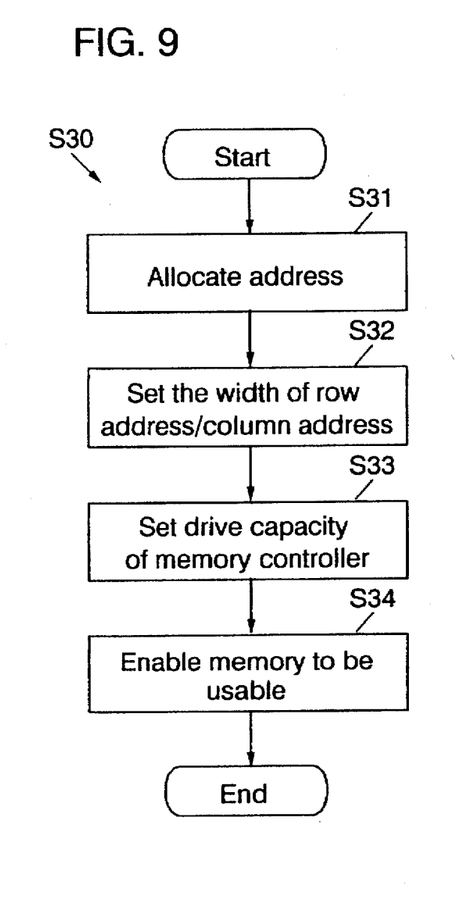
FIG. 9 is a flowchart for the entire POST program that is employed by the PC 1 according to the embodiment of the present invention.

It is preferable that the setup of the driving strength of the memory controller 13 be performed at the setup for the DRAM at step S30. FIG. 9 is a detailed flowchart of the setup routine for the DRAM.

As is shown in FIG. 10, the memories 15 and 17 are examined and an address is allocated for the memory space (step S31). Also, the width of the row address/column address is set up (step S32).

To perform the setups at steps S31 and S32, the POST requires attribute data concerning the installed DIMM card 17: the memory capacity, the chip arrangement, and the addressing method. The attribute data are normally provided by the maker of the DIMM card. In this embodiment, a table as is shown in Table 1 is stored in advance in the ROM 18 in order to control the attribute data for the individual DIMM cards. The CPU 11 (strictly speaking, software that the CPU 11 executes) can read the ID number of the installed DIMM card 17 via the gate circuit 19, the ISA bus 21, and the processor bus 12 (which was previously described). Therefore, the POST can perform the setups at steps S31 and S32 by referring to Table 1 in the ROM 18.

It is already known that the allocation of the address and the setup of the addressing method are performed by the POST program, and the present invention can be accomplished without any adverse affect even if other steps are included besides steps S31 and S32. The contents of Table 1 can be easily prepared based on the specifications for the DIMM card.

TABLE 1

| DIMM ID (ID4-1) | SIZE | BANK | DRAM | | ADDRESSING |
|---|---|---|---|---|---|
| 0000 | 4 MB | 2 | 512K × 8 | 4 | 10 × 9 |
| 0001 | 8 MB | 2 | 1M × 16 | 2 | 10 × 10 |
| 0010 | 16 MB | 2 | 2M × 8 | 4 | 11 × 10 |
| 0011 | 32 MB | 2 | 4M × 4 | 8 | 12 × 10 |
| 0100 | RESERVED | | | | |
| 0101 | RESERVED | | | | |
| 0110 | RESERVED | | | | |
| 0111 | RESERVED | | | | |
| 1000 | 2 MB | 1 | 512K × 8 | 4 | 10 × 9 |
| 1001 | 4 MB | 1 | 1M × 1B | 2 | 10 × 10 |
| 1010 | 8 MB | 1 | 2M × 8 | 4 | 11 × 10 |
| 1011 | 16 MB | 1 | 4M × 4 | 8 | 12 × 10 |
| 1100 | RESERVED | | | | |
| 1101 | RESERVED | | | | |
| 1110 | RESERVED | | | | |
| 1111 | RESERVED | | | | |

At step S33, the POST changes the driving strength of the memory controller 13 in response to the memory capacities and the chip structures of the memories 15 and 17.

As a premise for the adjustment of the driving strength of the memory controller 13, the optimal output current values for the signal lines (RAS, CAS, WE, and MA) must be examined when various types of DIMM cards are loaded into the DIMM slot 16. However, generally, the optimal output current values are not provided as specifications for a DIMM card. Because, although by referring to FIG. 8 and [Description of the Background] a phenomenon that has been confirmed is that the driving strength is affected in response to the memory capacity and the chip structure (or the number of banks) of the DIMM card, the optimal values for the signal lines are determined by the combination that is formed with the other hardware components (e.g., the memory controller 13, the standard memory 15, and the memory bus 20) in the PC 1. It has been observed that the optimal output current values for the signal lines when various DIMM cards 17 are loaded, and stored them as a table, as is shown in Table 2, in the ROM 18 in advance in order to manage the current values for each ID number of the DIMM card 17. Therefore, the POST can obtain the optimal output current values for the signal lines by reading the ID number of the DIMM card 17 and by referring to Table 2 in the ROM 18. The POST transmits a command to the selector 33 so that the output current values for the signal lines are desired values. Upon the receipt of the command, the selector 33 determines the number of buffers in the driver 32 that are to be attenuated.

TABLE 2

| DIMM ID | RAS CONTROL | CAS CONTROL | WE CONTROL | MA CONTROL |
|---|---|---|---|---|
| 0000 | 1(4 mA) | 3(12 mA) | 3(12 mA) | 2(8 mA) |
| 0001 | 1(4 mA) | 3(12 mA) | 3(12 mA) | 2(8 mA) |
| 0010 | 1(4 mA) | 3(12 mA) | 3(12 mA) | 2(8 mA) |
| 0011 | 2(8 mA) | 3(12 mA) | 3(12 mA) | 3(12 mA) |
| 0100 | RESERVED | | | |
| 0101 | RESERVED | | | |
| 0110 | RESERVED | | | |
| 0111 | RESERVED | | | |
| 1000 | 1(4 mA) | 2(8 mA) | 3(12 mA) | 2(8 mA) |
| 1001 | 3(12 mA) | 3(12 mA) | 3(12 mA) | 3(12 mA) |
| 1010 | 2(8 mA) | 2(8 mA) | 3(12 mA) | 2(8 mA) |

When all the setup processes are terminated, the memory is rendered usable (step S34), and program control moves to the next routine (the test on the DRAM (step S40)). The present invention has been described in detail by referring to the specific embodiment. However, it should be obvious to one having ordinary skill in the art that various modifications or revisions of the embodiment are possible within the scope of the present invention. In this embodiment, although the present invention has been explained by specifically referring to the memory controller, this is merely to confirm the purpose of the reduction of the memory access time. When the same problem occurs in another device, the present invention is naturally applicable in such a case. That is, although the present invention has been disclosed by using an example, it should not be limited to that example. To understand the subject of the present invention, claims should be referred to.

As is described above in detail, according to the memory access control apparatus and the memory access control method according to the present invention, even when multiple types of expansion memories (DIMM cards) that have different memory capacities and different memory chip arrangements are installed, the waveforms and the timings for the output signals of the memory controller can be dynamically compensated for.

As the advantage at the development step for the present invention, the damping resister and the end circuit do not have to be adjusted in consonance with each type of DIMM card. Thus, the development period can be reduced accordingly, and savings in the development expenses can be realized. Further, since various verifying tests can be performed regardless of whether or not a DIMM card is present, the period of time that is required for a confirmation test and its expense can be reduced.

We claim:

1. A memory access control apparatus, which is employed for a computer system in which an expansion memory in addition to a standard memory can be installed and which uses one or more signal lines to control access to said memory, comprising:

identification means for reading identification data for said expansion memory that is installed;

determination means for employing said identification data to determine optimal output current values for said signal lines; and means for employing results that are obtained with said determination means to adjust output current values of said signal lines.

2. A memory access control apparatus, which is employed for a computer system in which an expansion memory in addition to a standard memory can be installed and which uses one or more signal lines to control access to said memory, comprising:

identification means for reading identification data for said expansion memory that is installed;

determination means for storing in advance a relationship between said identification data and optimal output current values of said signal lines, and for employing said relationship that are so stored to determine said optimal output current values for said signal lines in response to said identification data;

adjustment means for adjusting output current values for said signal lines; and control means for employing the results that are obtained with said determination means to control said adjustment means.

3. A memory access control apparatus according to claim 1 or 2, wherein said expansion memory is a DIMM (Dual Inline Memory Module) card and said identification data is an ID number.

4. A memory access control apparatus according to claim 1 or 2, wherein said signal lines include a RAS signal line, a CAS signal line, a WE signal line, and a memory address bus.

5. A memory access control method, which is employed for a computer system in which an expansion memory in addition to a standard memory can be installed and which uses one or more signal lines to control access to said memory, comprising:

an identification step of reading identification data for said expansion memory that is installed;

a determination step of employing said identification data to determine optimal output current values for said signal lines- and an adjustment step of employing results that are obtained at said determination step to adjust output current values for said signal lines.

6. A memory access control method according to claim 5, wherein each of said steps are performed when said computer system is powered on.

7. A computer system comprising:

a CPU;

a standard memory;

slots for installing a plurality of types of expansion memories;

a memory controller for controlling access to said standard memory and said expansion memory via one or more signal lines that are coupled with said standard memory and said slots;

a ROM; and other peripheral devices, wherein output current values for said signal lines are stored in said ROM, correlated with types of said expansion memories.

* * * * *